United States Patent [19]

Akiyama et al.

[11] Patent Number: 4,785,251
[45] Date of Patent: Nov. 15, 1988

[54] DIGITAL FREQUENCY AND PHASE COMPARATOR

[75] Inventors: Tetsuo Akiyama; Satoshi Kusano, both of Saitama, Japan

[73] Assignee: Pioneer Electronic Corporation, Tokyo, Japan

[21] Appl. No.: 8,087

[22] Filed: Jan. 21, 1987

[30] Foreign Application Priority Data

Jul. 26, 1984 [JP] Japan .................. 59-112452[U]

[51] Int. Cl.$^4$ .................. H03K 5/26; G01R 23/00
[52] U.S. Cl. .................. 328/134; 307/526; 364/484; 328/83 D
[58] Field of Search .............. 328/133, 134; 302/525, 302/526, 528; 364/484; 324/83 D

[56] References Cited

U.S. PATENT DOCUMENTS

| | | | |
|---|---|---|---|
| 4,024,416 | 5/1977 | Fujita et al. | 328/133 X |
| 4,471,299 | 9/1984 | Elmis | 328/133 X |
| 4,488,108 | 12/1984 | Treise | 328/133 X |
| 4,578,705 | 3/1986 | Elmis et al. | 328/133 X |
| 4,600,994 | 7/1986 | Hayashi | 328/133 |

Primary Examiner—John S. Heyman
Attorney, Agent, or Firm—Sughrue, Mion, Zinn, Macpeak & Seas

[57] ABSTRACT

A digital frequency and phase comparator for both detecting a frequency of a digital signal and the phase thereof relative to a reference signal, wherein polarity inversions of the output phase different signal and saturated characteristics of the circuit when the phase difference succeeds a predetermined value are eliminated. The inventive digital frequency and phase comparator includes a time counter, an input holding circuit for holding a first and a second count value of the time counter at two different input timings of an input signal, a first arithmetic device for determining one of the frequency and period of the inputs signal in response to the first and second count values held by the input timing holding device, and a second arithmetic device for determining a phase of the input signal relative to a reference signal in response to a selected one of the first and second count values held in the input timing holding device.

11 Claims, 3 Drawing Sheets

DIGITAL FREQUENCY AND PHASE COMPARATOR

This is a continuation of Ser. No. 759,575, filed July 26, 1985.

BACKGROUND OF THE INVENTION

The present invention relates to a digital frequency and phase comparator for detecting a frequency of a digital signal and a phase thereof relative to a reference signal.

Generally, a digital frequency and phase comparator for comparing a frequency and a phase of an input pulse signal with those of a reference pulse signal to detect the differences in frequency and in phase therebetween is widely employed in the case where the input pulse signal is synchronized with the reference pulse signal, and various digital frequency phase comparators have been proposed.

FIG. 1 shows a phase comparator which has been widely used in a conventional digital frequency and phase comparator. In this drawing, a phase comparing portion 10 (enclosed by a chain line) is constituted by inverters 11 to 14, flip-flops 15 and 16, and NAND gates 17. Reference numeral 20 designates a current change-over switching circuit (also enclosed by a chain line). A reference pulse signal S and an input pulse signal P are applied to input terminals $IN_1$ and $IN_2$, respectively, of the phase comparing portion 10, and a phase difference signal D representing the phase difference between the input and reference pulse signals is produced at an output terminal OUT of the phase comparing portion 10.

In this arrangement, in normal operations, the phase difference signal D at the output terminal OUT has a pulse width corresponding to a phase difference, that is the difference in timing between rising edges of the reference and input pulse signals S and P, as shown in FIG. 2. Such a phase comparator is well known, for example, from U.S. Pat. No. 3,610,954, and therefore a further detailed description as to the operation thereof is omitted. A typical product implementing such a phase comparator is integrated circuit type MC-4044 manufactured by Motorola Inc.

In such a phase comparator shown in FIG. 1, there is a possibility that the output phase difference signal D will be inverted in polarity in the case where noise due to drop-out or the like occurs. Such a polarity inversion, as illustrated in FIG. 3, in the phase difference signal D occurs when a false input signal $b_1$ is caused by noise due to drop-out or the like in the input pulse signal. This makes it impossible to provide correct information as to the phase difference.

Further, the conventional digital frequency and phase comparator has a saturated characteristic, as shown in FIG. 4, when the frequency falls in a range in which the phase difference exceeds a predetermined value such as $\pm\pi$ or the like.

Thus, in the conventional digital frequency and phase comparator, there occur such problems as the phase difference signal, being inverted in polarity by a false input signal due to drop-out or the like, causing an erroneous controlling operation, and that the phase comparison characteristic, saturating in a frequency band where the phase difference exceeds a predetermined value, making it difficult to obtain a good transient response. Further, with the conventional phase comparator, it is impossible to detect the phase and frequency differences independently of each other.

SUMMARY OF THE INVENTION

An object of the present invention is therefore to solve the foregoing problems of the conventional digital frequency phase comparator.

Another object of the present invention is to provide a digital frequency and phase comparator in which the polarity of a phase difference signal is not inverted, even if there occurs a false input signal, in which phase and frequency differences can be detected independently of each other, and in which the phase comparison characteristic does not saturate.

In order to attain the foregoing objects, according to an important aspect of the present invention, a digital frequency phase comparator is provided comprising a time counter, input timing holding means for holding a first and a second count value of the time counter at two different input timings of an input signal, first arithmetic means for determining a frequency or a period of the input signal on the basis of the first and second count values held in the input timing holding means, and second arithmetic means for determining the phase of the input signal relative to a reference signal using a selected one of the first and second count values held in the input timing holding means, whereby the respective differences in frequency and in phase can be detected independently of each other, and, in any case, the phase difference signal is prevented from being inverted in polarity and the phase comparison characteristic is not saturated.

Other features and advantages of the invention will be apparent from the following description taken in conjunction with the accompany drawings.

DESCRIPTION OF THE PREFERRED EMBODIMENTS

Figure 1:
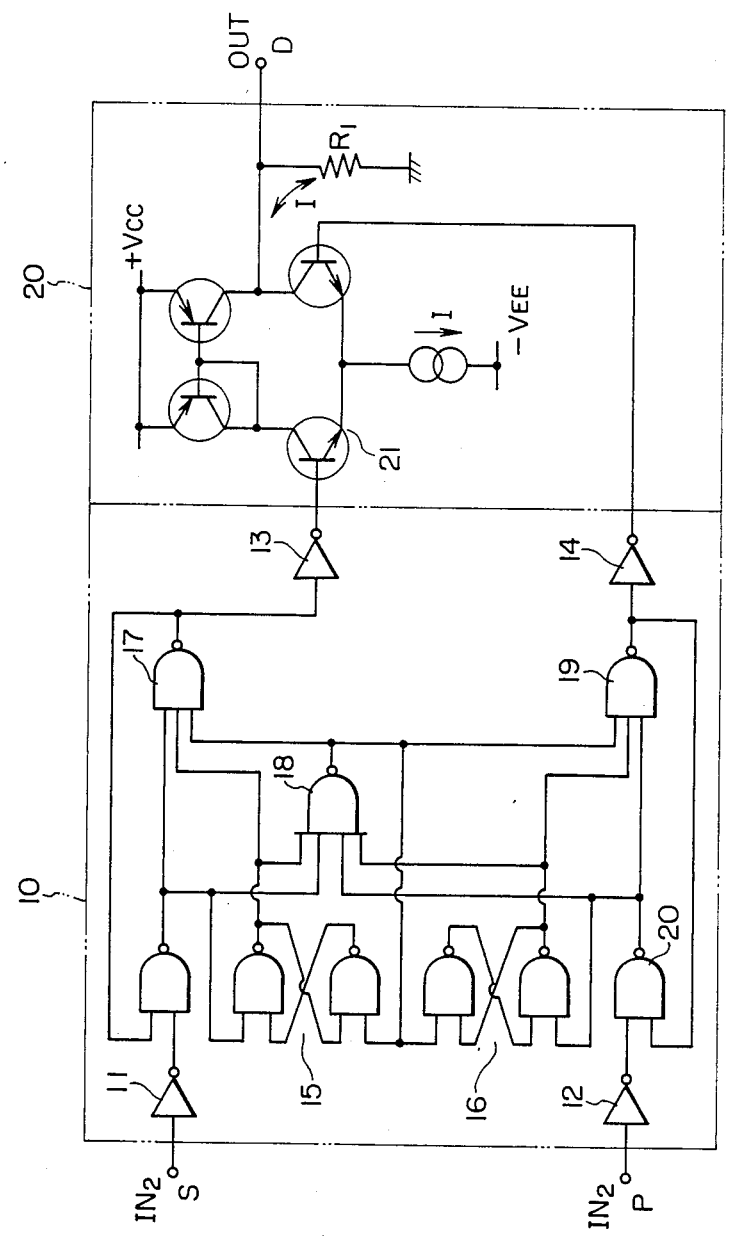
FIG. 1 is a circuit diagram of a conventional digital frequency and phase comparator.
Figure 2:
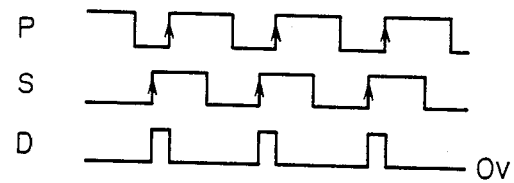
FIGS. 2 to 4 are operational waveform diagrams for the comparator of FIG. 1.
Figure 3:
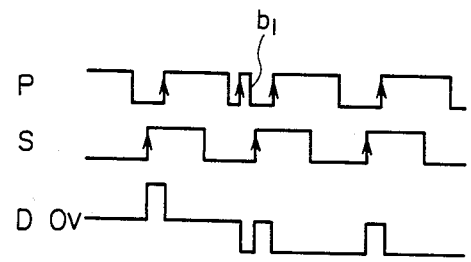
Figure 4:
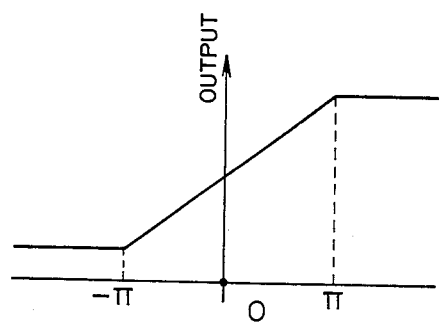
Figure 5:
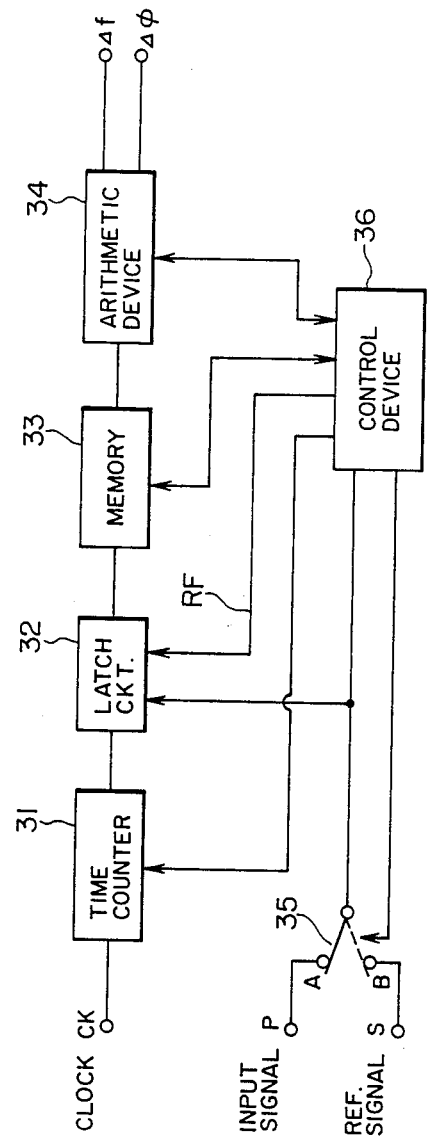
FIG. 5 is a block diagram of a preferred embodiment of a frequency and phase comparator according to the present invention.

Referring to FIG. 5 of the drawings, a preferred embodiment of a digital frequency and phase comparator constructed according to the present invention will be described.

In FIG. 5, a digital frequency and phase comparator is provided with a time counter 31 of the free-running type, a latch circuit 32 for holding a count value of the time counter 31 at the input timing of an input signal P, a memory 33 for storing an output of the latch circuit 32, an arithmetic device 34 for determining a frequency difference and a phase difference on the basis of the contents of the memory 33, a switch 35, and a control device 36 for controlling the operations of the other elements. A clock CK may be obtained from an external clock source, or a clock source may be provided in the control device 36.

Next, a description will be given of the operation of the digital frequency phase comparator shown in FIG. 5.

Assuming that the number of bits of the time counter 31 and the frequency of the clock CK applied to the time counter 31 are N and $f_{CK}$, respectively, the time counter 31 functions as a clock which cycles in a period of $2^2/f_{CK}$. Thus, one bit period of the time counter 31 corresponds to $1/f_{CK}$ seconds, and the period of the clock is selected in accordance with the desired accuracy of detection of the differences in frequency and phase. The period of time taken for the time counter 31 to cycle should be a value larger than the time required for measuring the period of the input signal.

In a frequency and phase comparing operation, the movable contact of the switch 35 is set to an input signal side contact A so that the input signal P is applied to the latch circuit 32 and the control device 36. When the input signal P, which is in the form of a train of pulses shaped to have good rise characteristics (or good fall characteristics), is applied to the latch circuit 32, respective count values of the time counter 31 at the rising edges of the respective pulses, that is, the respective points of time at the rise times of the respective pulses, are latched and held.

Upon reception of the pulses of the input signal P, the control device 36 causes the memory 33 to successively store the respective count values at the rising edges of the pulses as held in the latch circuit 32. That is, after a count value at the input timing of one pulse has been stored in the memory 33, the control device 36 applies a release signal RF to the latch circuit 32 to release latching, and then causes the latch circuit 32 to latch a count value of the time counter 31 at the input timing of the next pulse. It is a matter of course that a falling edge of each pulse may be employed as the input timing of the input signal P in place of the rising edge of each pulse.

The arithmetic device 34 is controlled by the control device 36 so as to successively read the count values, that is, the respective data of the input timings of the pulses, from the memory 33 to calculate a period $T_p$ of the input signal P according to the following equation:

$$T_P = T_N - T_{N-1}. \quad (1)$$

Here, $T_N$ and $T_{N-1}$ represent count values of the time counter 31 at the input timings of the present and preceding pulses, respectively.

The arithmetic device 34 performs the following calculation on the basis of the period $T_p$ of the input signal P and a reference frequency $f_S$ of the reference signal S to thereby obtain a frequency difference $\Delta F$:

$$\Delta f = 1/T_P - f_S. \quad (2)$$

Here, the reference frequency $f_S$ is applied as the reference signal S to the arithmetic device 34 from the control circuit 36 in the case where, for example, a reference signal source contained in the control device 36 is employed.

In the case where the reference signal S is externally applied, the reference signal S is applied to a contact B of the switch 35. Before the measurement of the period of the input signal P, the movable contact of the switch 35 is set to the contact B so that the respective count values of the time counter 31 at the input timings of the respective pulses of the reference signal S are latched by the latch circuit 32 and then stored in the memory device 33 in the same manner as in the foregoing case where the period of the input signal P is obtained. After this storage processing, the connection of the switch 35 is changed back to the contact A, that is, the input signal P side.

The reference frequency $f_S$ of the reference signal S is obtained by the arithmetic device 34 on the basis of the foregoing expression (1) and stored in the memory 33 and read therefrom when the calculation is performed on the basis of the foregoing expression (2). Although it is sufficient to obtain the reference frequency once because the reference frequency $f_S$ is assumed to be sufficiently stable, the respective periods of the input and reference signals P and S may be obtained by periodically moving the movable contact of the switch 35.

Figure 6:
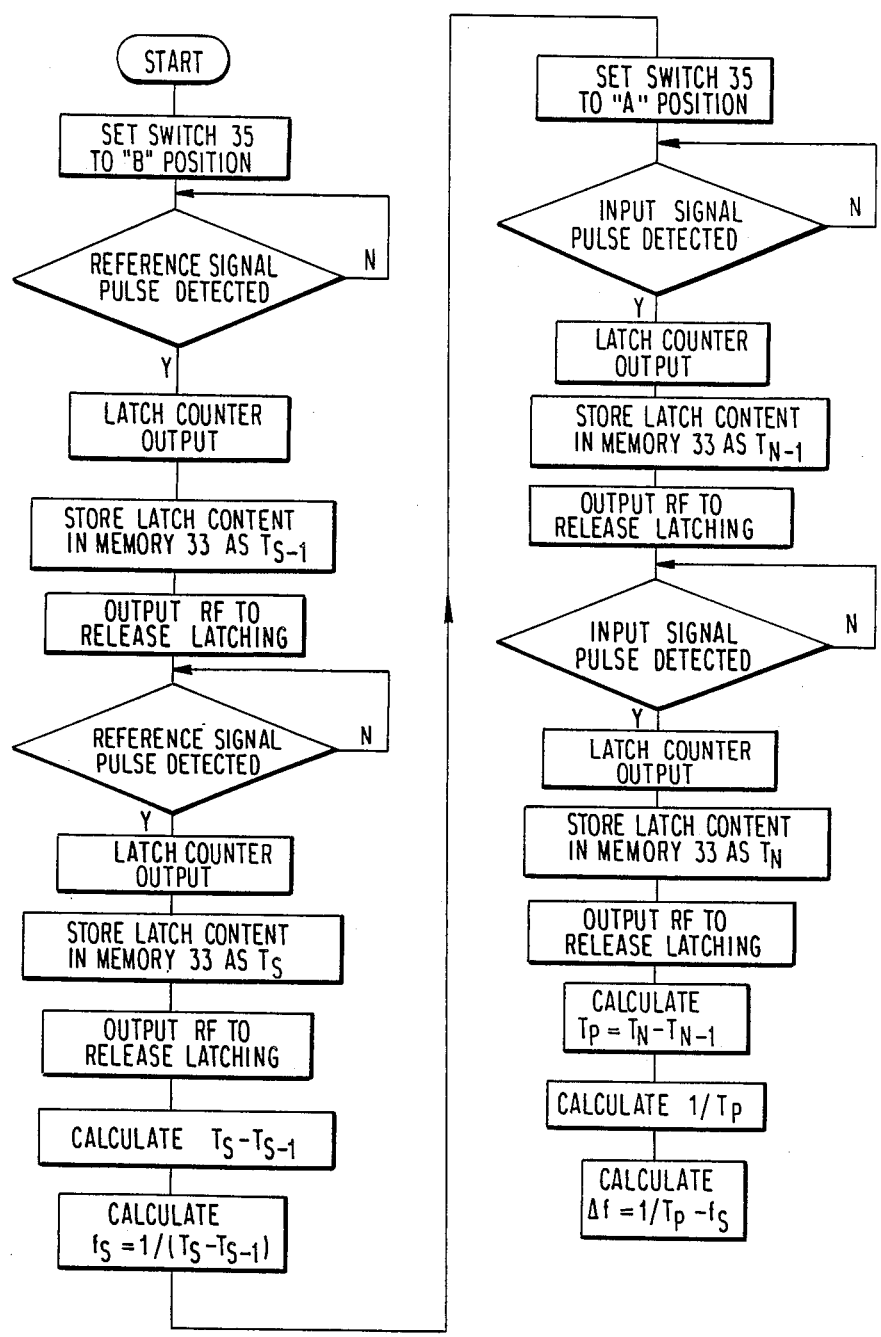
FIG. 6 is a flowchart showing in detail steps in the calculation of a frequency difference.

The above-described operations relating to calculation of the frequency difference are summarized in the flowchart of FIG. 6.

The phase difference $\Delta\phi$ between the input signal p and the reference signal S can be obtained in accordance with the following expression:

$$\Delta\phi = T_N - T_S, \quad (3)$$

where $T_S$ represents the input timing of a pulse of the reference signal S and $T_N$ represents the input timing of a pulse of the input signal P after input of the above-mentioned pulse of the reference signal S. This calculation is performed by the arithmetic device 34 under the control by the control device 36.

The input timing $T_S$ of the reference signal S is obtained from the relationship:

$$T_S = T_{S-1} + 1/f_S, \quad (4)$$

where $T_{S-1}$ represents the input timing of a preceding pulse of the reference signal S. That is, the input timing $T_S$ of the reference signal S is obtained such that, after the input timing $T_{S0}$ of the first pulse of the reference signal S has been stored in the memory 33 with the switch 35 connected to the contact B, the switch 35 is changed back to the contact A, that is, to the input signal P side. Thus, the respective input timings of the second and subsequent pulses of the reference signal S can be obtained by successively adding the value $1/f_S$ to the input timing $T_{S0}$. Alternatively, the switch 35 may be first set to the B side, and upon application of a pulse of the reference signal S, the count value of the time counter 31 at that time latched by the latch circuit 32, while at the same time the switch 35 is changed over to the A side so as to latch the input timing of the next pulse of the input signal P. In this case, a high-speed operation is required for the switch 35, the latch circuit 32, etc. The phase difference $\Delta\phi$ can be very accurately determined with this arrangement.

Figure 7:
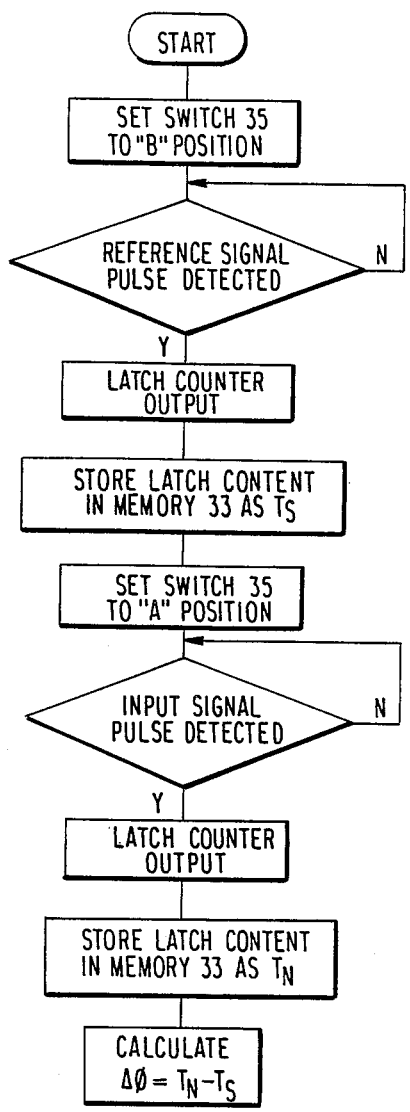
FIG. 7 is a flowchart showing in detail steps in the calculation of a phase difference.

The flow charts of FIGS. 6 and 7 may be completely executed by a microprocessor so that the operations of the arithmetic device 34, the control device 36 and possibly other elements of FIG. 5 are incorporated into the microprocessor.

The above-described operations relating to calculation of the frequency difference are summarized in the flowchart of FIG. 7.

When the period of the input signal P or the reference signal is to be obtained, an arrangement may be employed wherein N pulse intervals (N being an integer), that is, the time corresponding to a value an integer times as large as the period of the input or reference signal P or S, is latched in place of the difference in input timing between two successive pulses, and then the thus-determined time is divided by N to thereby obtain the reference period $T_S$ or the input signal period $T_p$. In this manner, the accuracy is improved and errors due to false input signals eliminated. In order to latch the count values of the time counter 31 every N pulse intervals, for example, a modulo-(n−1) counter or the like can be employed and the output thereof used as the release signal RF for the latch circuit 32.

Further, if the period $T_p$ of the input signal P is obtained on the basis of the foregoing expression (1), an arrangement may be employed wherein the present counter value $T_N$ held in the latch circuit 32 is directly added to output of the arithmetic device 34 so that the arithmetic device 34 calculates the period $T_p$ by using this value $T_N$ from the latch circuit 32 and the value $T_{N-1}$ read from the memory 33. In this case, the calculation processing can be performed at a high speed and can be simplified in comparison with the case where both the values $T_N$ and $T_{N-1}$ are read from the memory device 33 and used for calculations.

Further, in FIG. 5, the device according to the present invention can be constituted by a microprocessor including the latch circuit 32, the memory device 33, the arithmetic device 34, the control device 36, and in some cases, the time counter 31, in which case the device can be reduced in size and weight.

As described above, with the present invention, there are the following advantages: (1) it is possible to arrange the digital frequency phase comparator such that the frequency and phase differences can be separately detected; (2) input protection of the whole system can be simplified because an absence of polarity inversion can be generated in the phase difference output; (3) the transient response characteristic can be improved because the phase comparison characteristic does not saturate; and (4) the overall device can be constituted by a single microprocessor so as to make it possible to reduce the device in size as well as in weight because the device has a simple arrangement using only a single time counter.

We claim:

1. A digital frequency and phase comparator comprising:
    a time counter;
    input timing holding means for holding a first and a second count value of said time counter at two different input timings of an input signal; and
    arithmetic means for determining one of a frequency and a period of said input signal in response to said first and second count values held in said input timing holding means and for determining a phase of said input signal relative to a reference signal in response to a selected one of said first and second count values held in said input timing holding means.

2. The digital frequency and phase comparator of claim 1, wherein said input timing holding means comprises: a latch circuit for latching a count value of said time counter at an input timing of said input signal, and means for storing an output of said latch circuit.

3. The digital frequency and phase comparator of claim 2, wherein values are obtained from said storing means and said latch circuit, respectively.

4. The digital frequency and phase comparator of claim 2, wherein said first and second count values are obtained from said storing means.

5. The digital frequency and phase comparator of claim 1, wherein said input timing holding means further comprises means for holding at least one input timing of said reference signal.

6. The digital frequency and phase comparator according to any one of claims 1 to 5, wherein said time counter comprises a free-running counter driven only by a single clock.

7. The digital frequency and phase comparator according to claim 1:
    wherein said input timing means further holds a third count value of said time counter at an input timing of said reference signal;
    wherein said arithmetic means determines said phase in response to said selected one of said first and second counts values and to said third count values; and
    further comprising switching means for selectively switching a control input of said input timing means between an input terminal carrying said input signal and an input terminal carrying said reference signal at a timing between said timing of said reference signal and said two timings of said input signal.

8. In a microprocessor programmed with a method for digital frequency and phase comparison, comprising the following steps:
    counting a time signal;
    holding a first count value and a second count value of said counting step at two different input timings of an input signal;
    arithmetically determining one of a frequency and a period of said input signal in response to said first and second count values; and
    arithmetically determining a phase of said input signal relative to a reference signal in response to a selected one of said first and second count values.

9. A method as recited in claim 8, wherein said holding step comprises the steps of:
    latching a count value of said counting step at an input timing of said input signal; and
    storing a result of said latching step.

10. A method as recited in claim 9, further comprising holding at least one input timing of said reference signal.

11. A method as recited in claim 10, wherein said step of arithmetically determining said phase is further in response to said one input timing of said reference signal.

* * * * *